United States Patent
Skipor et al.

(10) Patent No.: US 9,748,699 B1
(45) Date of Patent: Aug. 29, 2017

(54) SCREW BOSS ASSEMBLIES AND METHODS

(71) Applicant: Amazon Technologies, Inc., Seattle, WA (US)

(72) Inventors: Andrew Frederick Skipor, West Chicago, IL (US); Sue Jean Swindlehurst, Morgan Hill, CA (US)

(73) Assignee: Amazon Technologies, Inc., Seattle, WA (US)

( * ) Notice: Subject to any disclaimer, the term of this patent is extended or adjusted under 35 U.S.C. 154(b) by 218 days.

(21) Appl. No.: 14/716,457

(22) Filed: May 19, 2015

(51) Int. Cl.
| | |
|---|---|
| F16B 37/04 | (2006.01) |
| H01R 13/652 | (2006.01) |
| F16B 39/02 | (2006.01) |
| H01R 4/36 | (2006.01) |
| F16B 37/02 | (2006.01) |
| F16B 5/02 | (2006.01) |

(52) U.S. Cl.
CPC ........... H01R 13/652 (2013.01); F16B 37/02 (2013.01); F16B 37/04 (2013.01); F16B 39/021 (2013.01); H01R 4/36 (2013.01); F16B 5/0275 (2013.01)

(58) Field of Classification Search
CPC ...... F16B 37/02; F16B 37/067; F16B 37/068; F16B 37/04; F16B 37/048; F16B 5/0275; Y10T 428/22
USPC .............................. 411/172, 546; 312/223.2
See application file for complete search history.

(56) References Cited

U.S. PATENT DOCUMENTS

| | | | | |
|---|---|---|---|---|
| 3,135,309 A * | 6/1964 | Soltysik | .................. | F16B 37/02 248/188 |
| 3,297,072 A * | 1/1967 | Galer | ...................... | F16B 37/02 411/177 |
| 3,406,734 A * | 10/1968 | Munse | ...................... | F16B 5/06 24/694 |
| 4,884,929 A * | 12/1989 | Smith | .................... | B64D 45/02 244/1 A |
| 5,249,901 A * | 10/1993 | Moore | .................... | F16B 37/02 29/525.04 |
| 5,667,328 A * | 9/1997 | Hofle | ........................ | F16B 5/04 403/242 |
| 6,213,578 B1 * | 4/2001 | LaGrotta | ................ | H05K 7/142 312/223.2 |
| 7,736,082 B1 * | 6/2010 | Mattheis | ................. | F16B 37/02 403/326 |
| 9,476,440 B2 * | 10/2016 | Hsu | ........................... | F16B 5/02 |
| 2003/0147714 A1 * | 8/2003 | Yu | ........................ | F16B 11/006 411/82 |

* cited by examiner

*Primary Examiner* — Flemming Saether
(74) *Attorney, Agent, or Firm* — Lee & Hayes, PLLC

(57) ABSTRACT

Systems and methods for providing screw bosses on a substrate. The substrate can be dimpled. The dimples can then be threaded to accept screw bosses. The dimples can be threaded using a threading die or can have threads cut by self-tapping screw bosses. An adhesive can be applied to the substrate, the bottom of the screw boss, or both. The screw bosses can include standoffs to determine the distance between the bottom of the screw boss and the substrate. The screw bosses can be threaded onto the dimples and can provide threads for attaching items to the substrate. A filler material can be applied to the reverse side of the substrate to fill-in the dimples and present a smooth surface. A decorative or protective layer can be applied over the filler material.

12 Claims, 11 Drawing Sheets

SCREW BOSS ASSEMBLIES AND METHODS

BACKGROUND

Electronic devices are ubiquitous in modern society. People use computers, laptops, cell phones, gaming systems, and other devices constantly. These devices often consist of printed circuit boards (PCBs), screens, including touch-screens, keyboards, and other devices, which are generally assembled in an aesthetic and/or protective case. The PCBs can include multiple chips and other devices depending on the purpose of the device.

To assemble these devices, the electronics are often mounted on the PCB using a pick-and-place machine, for example, and then mechanically and electrically attached to the PCB using a solder reflow, or other suitable, process. The PCB can then be mounted to a backing plate, which can then be mounted to the case, or the PCB can be directly mounted to the case. It is useful, however, if the mounting system can also act as an electrical connection (e.g., a ground plane or power connection) for the PCB and other electronics.

Providing a suitable mounting system for the electronics on, or within, the case poses some issues, however. In many cases, the mounting system must not only provide a ground plane for the electronics, for example, but must also pass drop tests and other tests related to strength and reliability. The case and the mounting bosses may also be manufactured from dissimilar metals, which can make welding difficult, or impossible, and can create dissimilar metal corrosion. Dissimilar metals may also create issues with grounding.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Examples of the present disclosure relate generally to providing screw bosses for mounting applications and specifically to providing screw bosses for mounting printed circuit boards (PCBs) and other electronics on substrates for use in personal electronics. The systems and methods described herein can provide a mounting boss on a number of formable substrates that can provide both a ground path and suitable physical properties. The mounting bosses can be designed to have the desired properties with respect to shear and tensile strength, for example, and/or to pass various strength tests. In some examples, the mounting bosses can be designed and attached such that they survive drop tests, and/or other impact tests, to ensure the resulting electronic devices will be reliable and durable.

Figure 1:
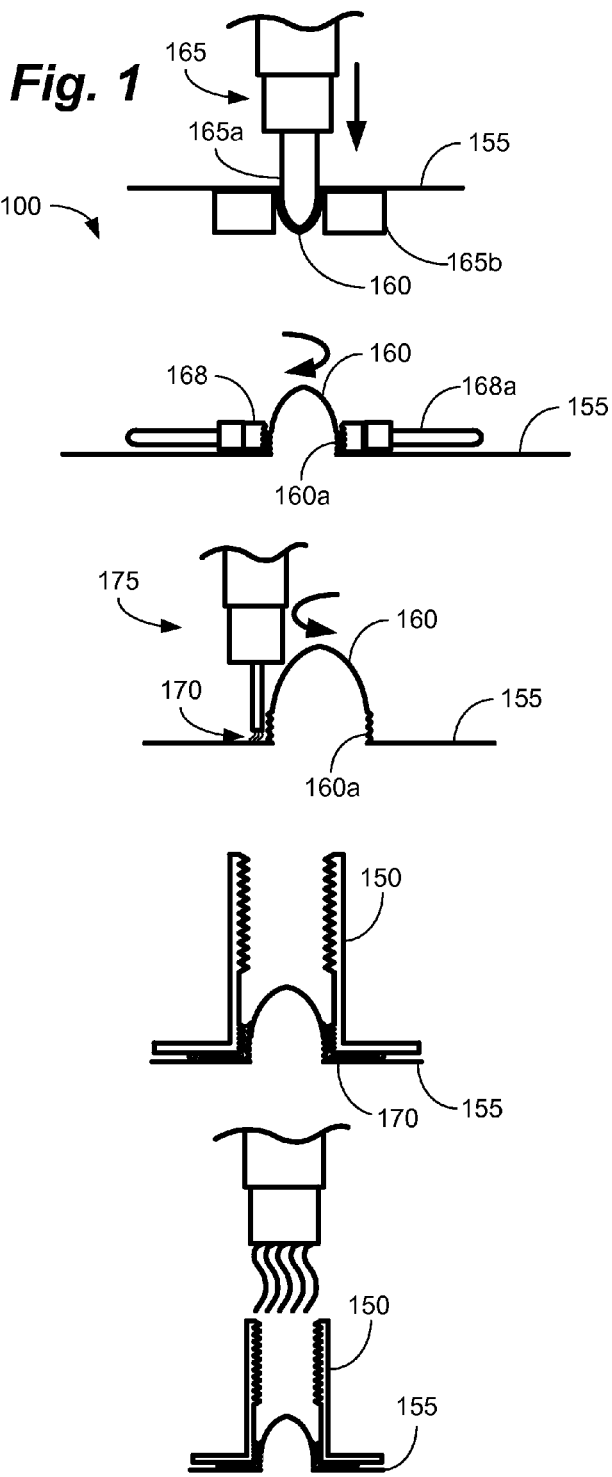
FIG. 1 is a pictorial flow diagram of an illustrative process for providing a screw boss assembly on a substrate, in accordance with some examples of the present disclosure.
Figure 1:
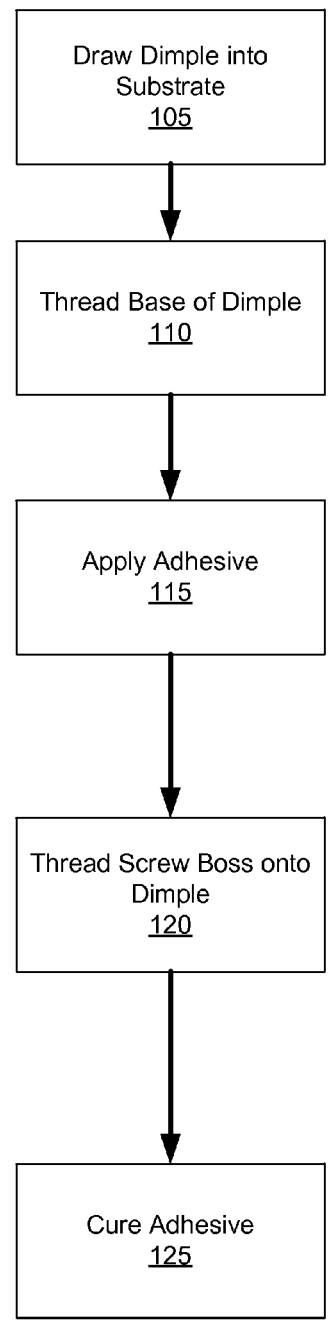

As shown in FIG. 1, examples of the present disclosure can comprise a system and method 100 for providing a screw boss assembly 150 on a first substrate 155. The substrate 155 can comprise a number of materials that can be formed, drawn, pressed, or otherwise formed to provide dimples on the surface. The formable substrate 155 can comprise a number of materials including, but not limited to, plastic, aluminum, steel, stainless steel, magnesium, brass, and tin. In some examples, the substrate 155 can act as a ground plane for the electronics mounted thereon. In this configuration, therefore, the substrate 155 can comprise a conductive material.

At 105, to provide a mounting surface for a screw boss assembly 150, a dimple 160 can be created in the substrate 155 using a suitable method. This can include using a dimple-die machine 165, for example, in which a bit 165a forces the substrate 155 through a die 165b to form the dimple 160. In other examples, the dimple 160 can be formed using a punch press, hydraulic press, or other forming machine. Of course, other methods for metal forming and drawing are available and are contemplated herein. In some examples, the dimple 160 can be formed in the substrate 155 without tearing or piercing the substrate 155. This may be useful when structural integrity of the substrate 155 is paramount, for example, or when isolation between one side of the substrate 155 and the other is desired. In other examples, the substrate 155 may be dimpled and perforated to provide a physical pathway from one side of the substrate 155 to the other. This may be useful to provide pathways for cables or other connections from one side of the substrate 155 to the other, for example.

At 110, in some examples, a portion 160a of the dimple 160 can be threaded using a suitable method. In some examples, the dimple 160 can be threaded using a thread die 168. The threading die 168 can be placed over the dimple 160 to the point of engagement and then rotated to cut threads into an outer portion 160a of the dimple 160. The threading die 168 can be rotated directly by a tapping machine, for example, or using a suitable tool such as a tap handle 168a. In other embodiments, the threads 160a can be formed using other suitable methods such as, for example, milling or rolling. In some examples, as discussed below, this step can be optionally replaced with a "self-tapping" screw boss 150 (i.e., one that creates its own threads in the dimple 160 as it is installed).

At 115, adhesive 170 can be applied to the substrate 155 proximate the dimple 160. In some examples, the adhesive can be applied to the base of the screw boss 150. In some examples, the adhesive 170 can be applied with an automatic or robotic applicator 175 to provide a bead around the dimple 160. In other examples, the adhesive 170 can be manually applied with an applicator gun or other suitable means. The adhesive 170 can be applied with a predetermined height, or thickness, to produce the desired bond strength between the screw boss 150 and the substrate 155. The adhesive can enable a screw boss 150 to be mounted on the dimple 160 and can provide additional strength at the junction therebetween.

The adhesive 170 can be chosen based on, for example, the required bond, shear, and tensile strengths for a particular product, for example, as well as the type of testing the product must endure. Products, such as cell phones and tablets, which are subjected to drop tests, for example, may require an adhesive with lower overall bond strength, but that produce a more resilient joint. In this manner, when subjected to drop tests, for example, the adhesive is strong enough to retain the screw bosses 150 on the dimples 160, but resilient enough that it does not shatter upon impact. Other products, where tensile strength is the main concern, may use a more brittle, or "glassy," adhesive, that has a higher tensile strength, for example, but is not as "tough." This can be useful for products that are subjected to bending, or other forces, but are not subjected to shocks. The adhesive 170 can comprise, for example, multipart epoxy, acrylic, or urethane adhesive, among other things.

At 120, the screw boss 150 can be threaded onto the dimple 160. Threading the screw boss 150 onto the dimple 160 can achieve multiple ends. Threaded engagement between conductive (e.g., metal) elements, for example, generally provides a good, low resistance electrical connection. In some examples, therefore, the threaded engagement between the screw boss 150 and the dimple 160 can enable the substrate 155 to act as a power or ground plane for electronics mounted on the screw bosses 150. Threading the screw boss 150 onto the dimple 160 can also enable the screw boss 150 to squeeze, flatten, and spread the adhesive 170 between the screw boss 150 and the substrate 155. In this manner, good mechanical adhesion and proper adhesive layer thickness can be controlled. As discussed below, devices on the screw boss 150 can also ensure consistent adhesive layer thickness by mechanically setting the height of the screw boss 150 above the substrate when in the installed, or "screwed down," position.

At 125, the adhesive can be cured. In some examples, the adhesive can be an air-drying adhesive or glue and can simple be given time to "dry." In other examples, the adhesive can comprise an adhesive agent and a catalyst, or a multipart adhesive (e.g., two part epoxy), which cures as the result of a chemical reaction. In other examples, energy can be applied to accelerate the curing process. Depending on the type of adhesive, the curing process can be accelerated using a variety of known methods including, for example, heat (thermal), infrared (IR), radio frequency (RF), or ultraviolet (UV) curing. In still other examples, the adhesive can comprise a moisture curing urethane, for example, and can cure upon exposure to the ambient humidity in the air. Of course, this process can be accelerated with the introduction of additional moisture (e.g., steam).

The resulting product can comprise a substrate 155 that includes one or more screw bosses 150 to enable additional items (e.g., electronics, PCBs, etc.) to be mounted on the substrate 155. The use of dimples 160 and adhesive 170 enables the screw bosses 150 to be made of an advantageous material (e.g., steel) for their purpose. At the same time, the system 100 enables the use of different materials for the substrate (e.g., aluminum or titanium sheet) that provide good protection and or aesthetic properties for the end product (e.g., a cell phone or tablet). In some examples, as discussed below, the screw bosses 150 can also include standoffs to provide a repeatable adhesive thickness and "squish" (i.e., the amount of compression applied to the adhesive upon installation of the screw boss 150).

Figure 2A:
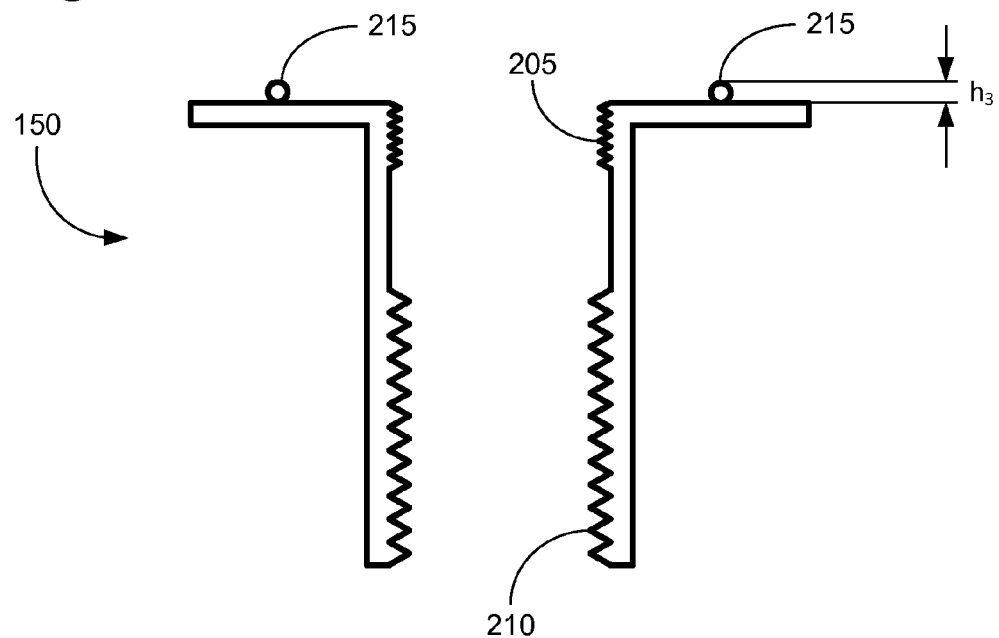
FIG. 2A is a cross-sectional view of a screw boss, in accordance with some examples of the present disclosure.
Figure 2B:
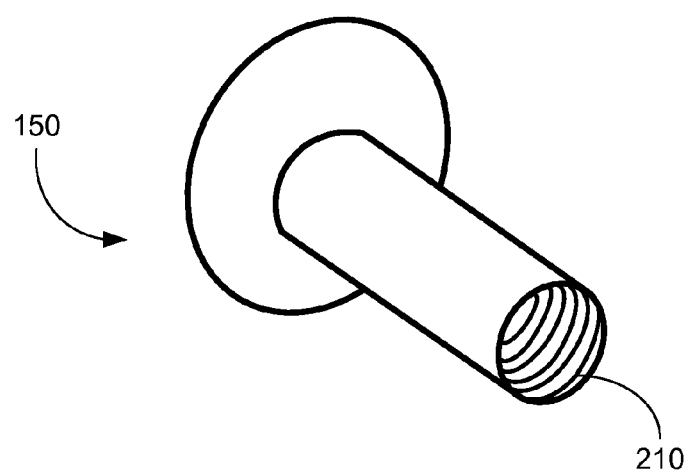
FIG. 2B is a front, perspective view of the screw boss of FIG. 2A, in accordance with some examples of the present disclosure.

As shown in FIG. 2A-2B, in some examples, the screw boss 150 can comprise a first set of internal threads 205 on a first end of the screw boss 150 and a second set of internal threads 210 on a second end of the screw boss 150. In this manner, the first set of internal threads 205 can be screwed onto the dimple 160 to provide a mechanical and/or electrical connection. In some examples, the first set of threads 205 can be self-tapping. In other words, to assemble the screw boss 150 onto the dimple 160, the screw boss 150 can simply be placed over the dimple 160 and rotated with a suitable tool and/or with suitable force and pressure. In this configuration, as the screw boss 150 is rotated, the first set of threads 205 can cut threads (e.g., remove or "roll" material) such that external threads are formed on the dimple 160. In this manner, the step 110 for threading the dimple 160 may be obviated. This may be desirable to reduce manufacturing time and expense, for example, and/or to reduce and simplify the tooling required to produce the system. In some examples, such as when the substrate 155 material is very hard, a portion of the threads can be formed prior to the installation of the screw boss 150 and the remainder can be formed by the screw boss 150—i.e., the screw boss 150 can be "partially self-tapping."

In some examples, the second set of threads 210 can enable a variety of elements to be attached to the screw boss 150 and thus, to the substrate 155. Multiple screw bosses 150 can be used to mount a PCB, electronics packages, fuse holders, or other items, to the substrate 155. In addition, as mentioned above, the screw boss 150 can act as a power or ground connection for the PCB, or other items, with the first set of threads 205 creating an electrical pathway from the item mounted on the screw boss 150, through the screw boss 150 (e.g., via a fastener or contact pad), and to the substrate 155.

In some examples, the second set of threads 210 can be a different size and/or thread pitch than the first set of the threads 205. As mentioned above, the first set of threads 205 can be self-tapping, for example, and thus can have a fairly coarse or tapered thread pitch for engaging with a malleable material such as aluminum. The second set of threads 210, on the other hand, can have machine threads for engaging a fastener such as, for example, a metric or standard thread. 6-32×¼" machine screws are commonly used for computer cases, for example, while 3 mm×0.5 machine screws are commonly used for solid state drives. In still other embodiments, the first set of threads 205 and the second set of threads 210 can have the same thread pitch and size to reduce manufacturing complexity, among other things.

In some examples, as shown in 2C and 2D, the screw boss 150 can also comprise one or more stand-offs 215. As discussed below, the stand-offs 215 can set the height at which the screw boss 150 is mounted on the substrate 155. See, Discussion of FIG. 6, below. In this manner, the thickness of the adhesive 170 can be controlled, among other things. In other words, as the screw boss 150 is screwed onto the dimple 160, the installed height of the screw boss 150 (i.e., the height above the substrate 155) and thus, the thickness of the adhesive 170 layer is precisely controlled and highly repeatable. In addition, because the screw boss 150 can compress the adhesive 170 as it is threaded onto the dimple 160, good mechanical contact between the screw boss 150, the adhesive 170, and the substrate 155 is provided as the adhesive 170 cures. This compression increases mechanical contact between the adhesive 170, substrate 155, and screw boss 150, removes air bubbles, and creates a fixed adhesive thickness, among other things.

Figure 2C:
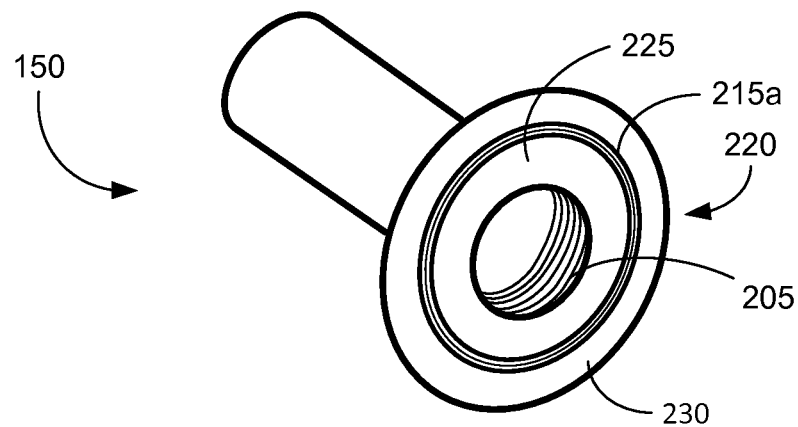
FIGS. 2C and 2D are bottom, perspective views of screw bosses with different types of standoffs, in accordance with some examples of the present disclosure.

As shown in FIG. 2C, in some examples, the stand-offs 215 can comprise a raised, circular ring 215a disposed on a bottom face, or base portion 220, of the screw boss 150. In this manner, substantially even pressure can be applied to the adhesive 170 and the substrate 155 as the screw boss 150 is screwed onto the dimple 160 and bottoms out. In addition, in some examples, the circular standoff 215 can contain the adhesive 170 to an inner portion 225 of the base 220 to prevent leakage of the adhesive 170 onto unwanted portions of the substrate 155. This can prevent adhesive 170 from leaking onto the circuit traces printed on the PCB, for example.

In still other examples, the standoff 215 can bisect the adhesive such that a first portion of the adhesive 170 is disposed on an outer portion 230 of the base 220 and a second portion of the adhesive 170 is disposed on the inner portion 225 of the base 220. This can provide additional surface area between the adhesive 170 and the base 220 of the screw boss 150, for example, to increase bonding strength in some applications. In yet other examples, adhesive 170 can be applied such that it covers only the outer portion 230 of the base 220. This may be useful to keep the adhesive 170 of the threads 160a to maintain conductivity between the screw boss 150 and the substrate 155.

Figure 2D:
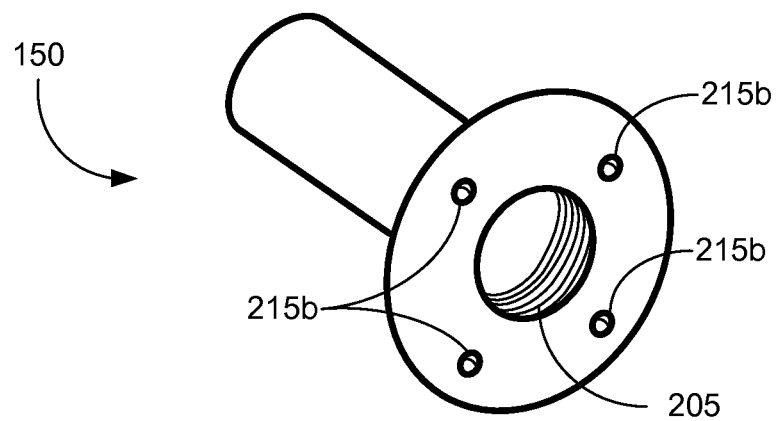
Figure 3:
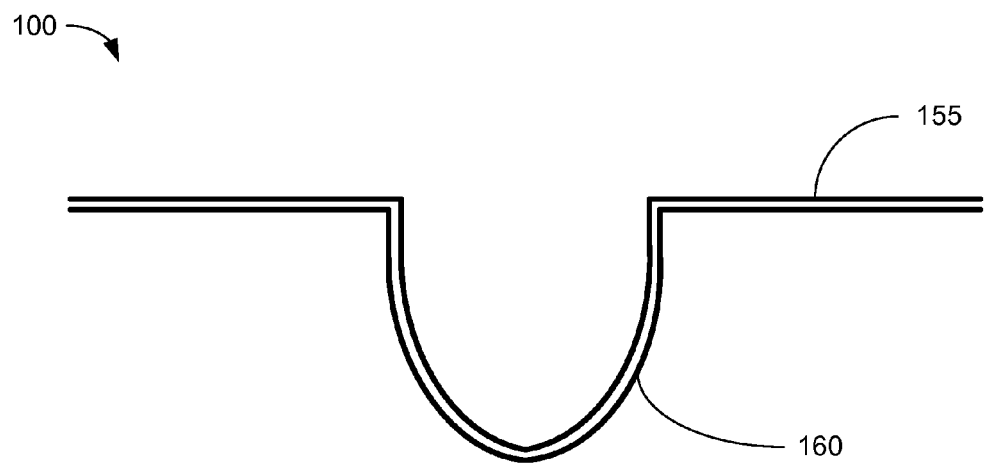
FIG. 3 is a cross-sectional view of a substrate with a dimple formed therein, in accordance with some examples of the present disclosure.

In other examples, as shown in FIG. 2D, the standoffs 215 can comprise a plurality of bumps 215b, or protrusions, disposed on the base 220. The number and spacing of the bumps 215b can be varied based on various manufacturing elements. Soft substrates 155, for example, may require a higher number of bumps 215b to more evenly distribute the clamping force between the screw boss 150 and the substrate 155. This tends to lessen the tendency of the bumps 215b to gouge, or otherwise damage the substrate 155. Fewer bumps 215b may be required on very hard and/or stiff substrates 155, on the other hand, as they are less likely to be damages and provide better alignment, for example.

In some examples, the number of bumps 215b can also be varied to increase or decrease the surface area between the adhesive 170, the screw boss 150, and the substrate 155. In other words, increasing the number of bumps 215b decreases the surface area between the screw boss 150 base 220, the adhesive 170, and the substrate 155, and vice versa. In this manner, the bumps 215b can also be used to tune the strength of the adhesive joint between the screw boss 150 and the substrate 155. This may be useful, for example, to ensure that the joint is strong enough to survive a drop test, but not so strong that it causes catastrophic failure to other components in the process.

As shown in detail in FIGS. 3-7, the system 100 can include a substrate 155 comprising a piece of sheet metal, or other malleable material, into which a dimple 160 is formed. As shown, in some examples, the dimple 160 can have a substantially round profile. In other examples, the dimple 160 can have other shapes and could be square on the bottom with substantially parallel walls, for example. Of course, the shape of the dimple 160 could be many other shapes depending on the tooling used.

The substrate 155 can comprise sheet metal, for example, or another malleable material that enables dimples 160 to be formed on the substrate 155. In some examples, the substrate 155 can be conductive to enable the substrate 155 to act as a power or ground plane for any electronics mounted thereon. The substrate 155 can comprise, for example, mild steel, stainless steel, aluminum, or magnesium. In some examples, the substrate 155 can also comprise a surface coating to prevent corrosion, promote or inhibit conductivity, or to improve bonding between the substrate 155 and the adhesive 170. In some examples, some portions of the substrate 155 can be conductive, while other portions are insulated, depending on the elements to be mounted on the substrate 155.

Figure 4:
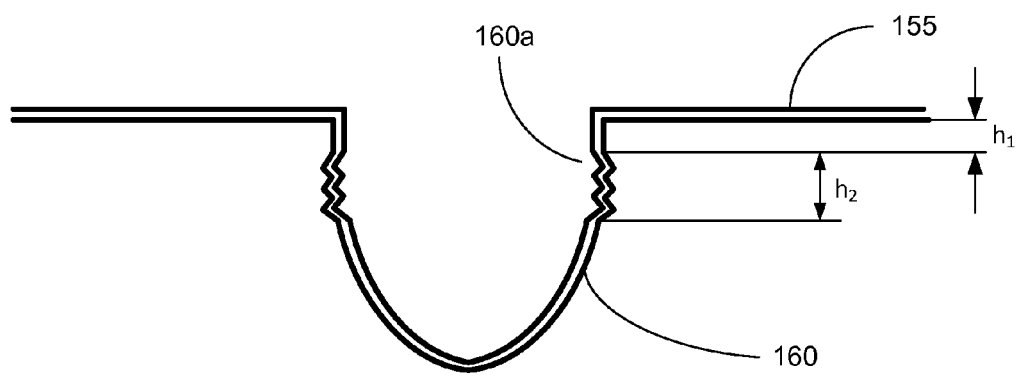
FIG. 4 is a cross-sectional view of the dimpled substrate of FIG. 3 after forming threads on a portion of the dimple, in accordance with some examples of the present disclosure.

As shown in FIG. 4, threads 160a can be formed on the dimple 160. In some examples, the threads 160a can be formed in the conventional manner—i.e., using a die—prior to installation of the screw boss 150. In other embodiments, the screw boss 150 can comprise self-tapping threads that can cut threads into the dimple 160 upon installation. In some examples, the threads 160a can also include an additional thread coating including, for example, thread locker, lubricant, or conductivity promoter or inhibitor.

In some examples, the threads 160a can be cut down to the surface of the substrate 155. In other words, when in the installed, or screwed down, position, the base 220 of the screw boss 150 sits substantially flush with the substrate 155. In other embodiments, the threads 160a may be spaced a predetermined distance, $h_1$, from the substrate 155. This can provide a space below the screw boss 150 to contain adhesive, for example, or simply to prevent the screw boss 150 from scratching, denting, or otherwise altering the substrate 155. In other embodiments, the distance between the start of the threads 160a and the substrate 155, $h_1$, can coincide with the height of the standoffs 215.

The threads 160a can extend a predetermined height, $h_2$. In some examples, the height of the threads 160a can be limited by the geometry of the dimple 160. In other words, if the dimple 160 is curved, as shown, the thread height, $h_2$, can be limited by the engagement between the inner diameter of the screw boss 150 and the outer diameter of the dimple 160. In other examples, the thread height, $h_2$, can be a predetermined height based on, for example, the thread engagement required to provide the desired electrical conductivity or mechanical strength, among other things.

Figure 5:
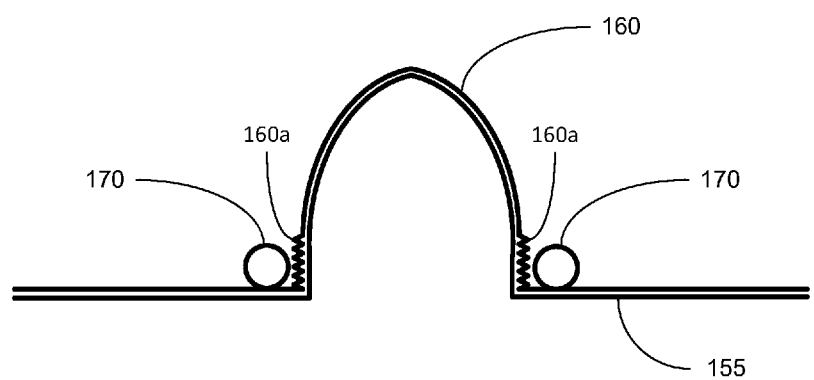
FIG. 5 is a cross-sectional view of the dimpled, threaded substrate of FIG. 4 after applying adhesive to a portion of the substrate, in accordance with some examples of the present disclosure.

As shown in FIG. 5, regardless of how the threads 160a are formed on the dimple 160 (i.e., prior to installation of the screw boss 150 or during installation of the screw boss 150), adhesive 170 can then be applied to the substrate 155, the dimple 160, or both. In some examples, the adhesive 170 can be applied in a bead on the substrate 155 proximate the base of the dimple 160. In other embodiments, the adhesive 170 can be applied in drops or globules around the base of the dimple 160. In other examples, the adhesive 170 can be applied to the base 220 of the screw boss 150 prior to installation. In any case, the adhesive 170 can be applied such that, when the screw boss 150 is screwed down onto the dimple 160, the adhesive 170 is compressed, spread, and/or flattened to the appropriate thickness and diameter to produce the desired bond strength between the screw boss 150 and the substrate 155. As mentioned above, the bond strength can be determined based on testing requirements (e.g., drop tests), the strength of surrounding materials and junctions, the electronics used, or other factors.

In some examples, adhesive 170 may be applied to the substrate 155 such that it does not coat the threads 160a to enable the threads 160a to act as a conductor between the screw boss 150 and the substrate 155. In this manner, the mechanical connection between the screw boss 150 and the threads 160a provides a relatively low resistance connection for use as a conductor or ground plane, for example, without being affected by the adhesive 170. This obviates the need for conductive adhesives between the screw boss 150 and then substrate, which tend to be expensive and may require additional processing (e.g., special handling or forced drying).

Figure 6A:
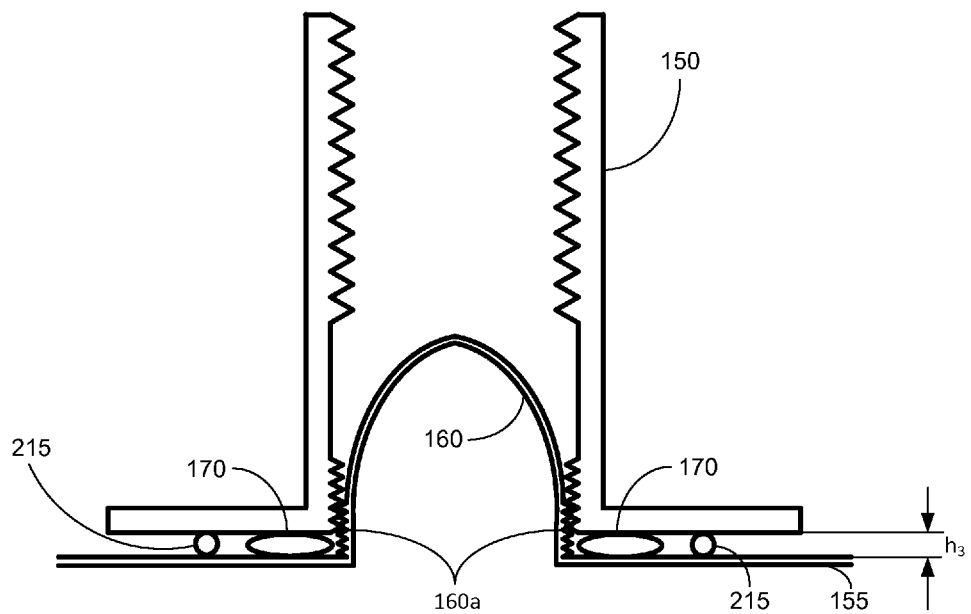
FIG. 6A is a cross-sectional view of the substrate of FIG. 5 after a screw boss has been threaded onto the portion of the dimple, in accordance with some examples of the present disclosure.

As shown in FIG. 6A, as the screw boss 150 is threaded onto the dimple 160, the adhesive is compressed, or "squished." This process can provide the desired thickness for the adhesive layer. In addition, the pressure provided by the screw boss 150 also creates good mechanical adhesion between the adhesive 170, the screw boss 150, and the substrate 155, further increasing bond strength.

The height, h3, of the screw boss 150 above the substrate 155 is set by the stand-offs 215. In this manner, the standoffs 215 can provide precise and repeatable installation heights between the screw boss 150 and substrate 155. This can improve quality and consistency, reduce manufacturing time and cost, and facilitate automated manufacturing, among other things. As discussed above, the standoffs 215 can also enable the proper adhesive 170 film thickness to be set by controlling the amount of squish between the screw boss 150 and the substrate 155.

Figure 6B:
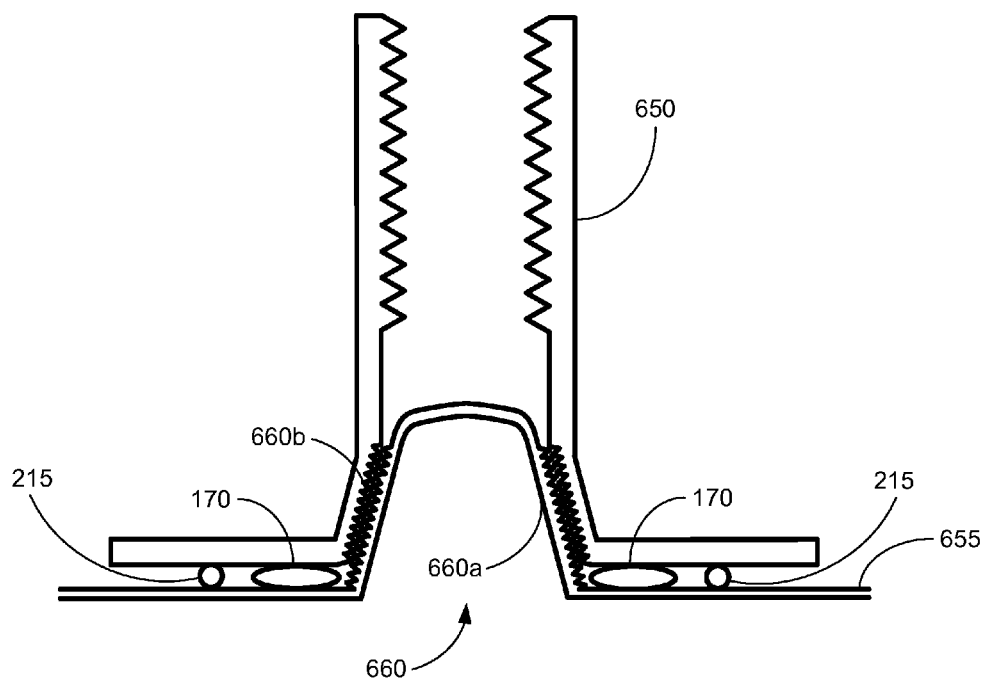
FIG. 6B is a cross-sectional view a screw boss with tapered threads after it has been threaded onto a portion of a tapered dimple, in accordance with some examples of the present disclosure.

In some examples, as shown in FIG. 6B, the dimple 660 can be formed with tapered sides 660a. In this manner, tapered, or conical, threads 660b can be formed on the dimple 660 and complementary tapered threads can be formed on the screw boss 650. This may be useful, for example, for particularly malleable substrates 655 or screw bosses 650 and may provide additional contact area. The additional contact area may improve conductivity between the screw boss 650 and the dimple 660 and may provide additional clamping force. In some case, conical threads can also more accurately locate the screw boss 650 on the substrate 655 because they tend to be self-centering.

Figure 7:
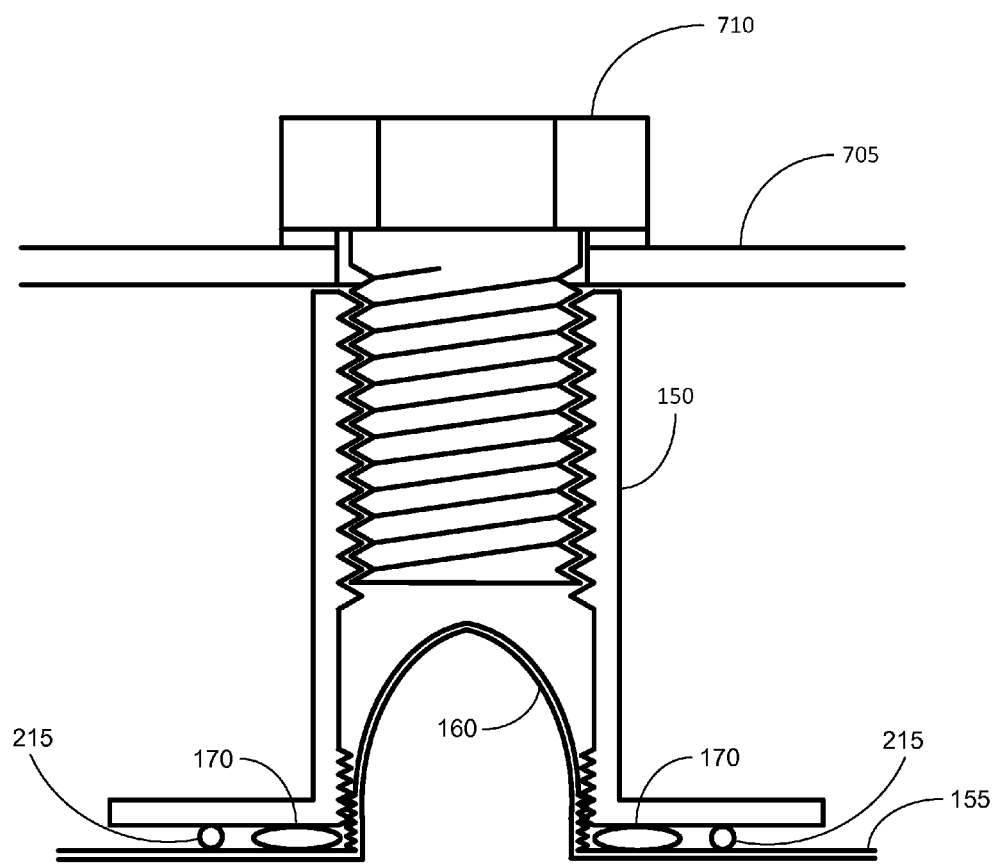
FIG. 7 is a cross-sectional view of the substrate of FIG. 6 with a second substrate screwed to the screw boss using a fastener, in accordance with some examples of the present disclosure.

As shown in FIG. 7, the screw boss 150 can enable a second substrate 705 to be attached to the substrate 155 using a fastener 710. In some examples, the second substrate 705 can comprise, for example, a PCB, electronics package, antenna, cover, microphone, or speaker. The fastener 710 can comprise, for example, a screw, bolt, rivet, pin, or additional adhesive. Using a conductive fastener can also provide an additional electrical path, or connection, between the second substrate 705, the screw boss 150, and the substrate 155.

Figure 8:
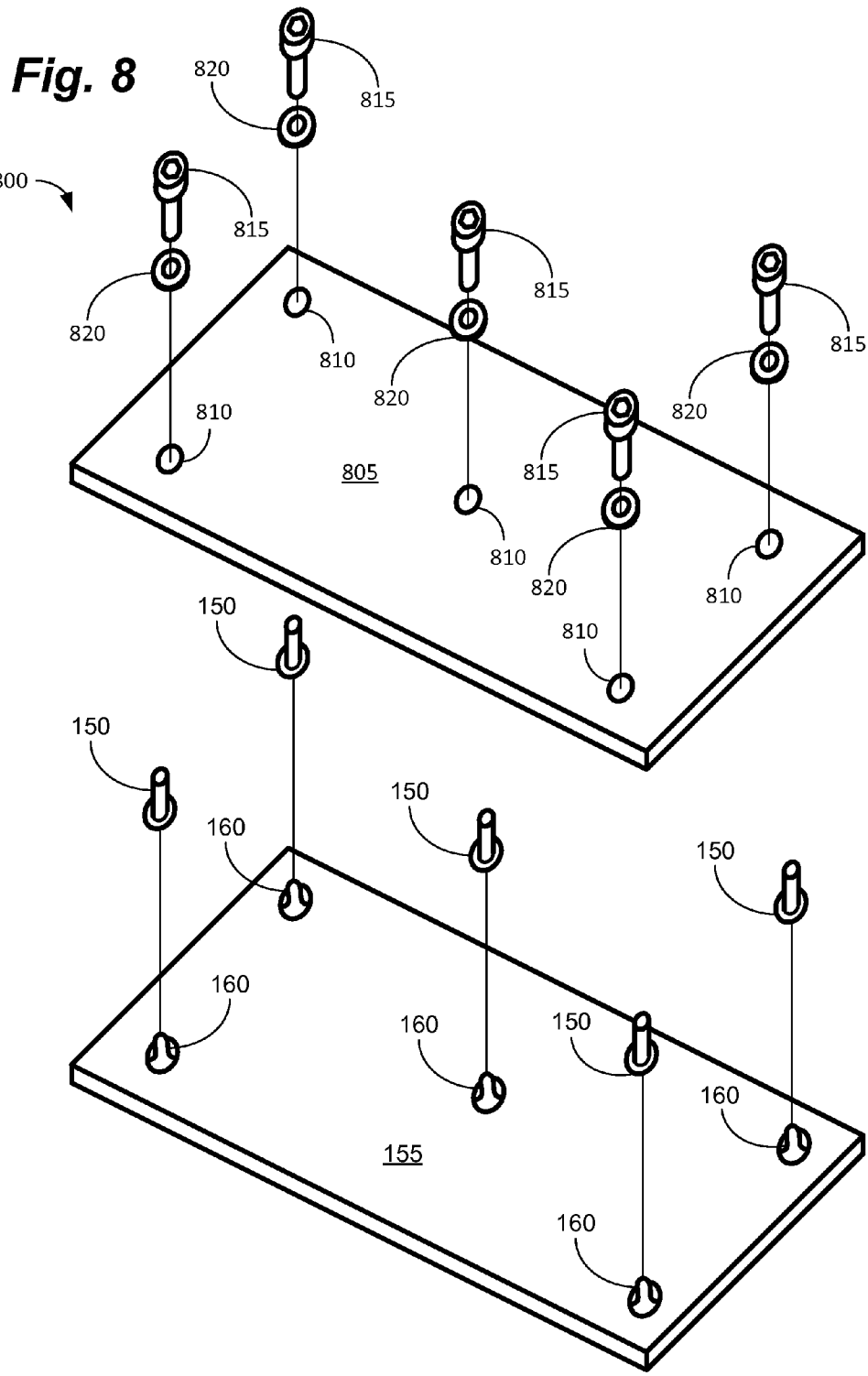
FIG. 8 is an exploded view of a second substrate attached to a first substrate using a plurality of screw bosses and fasteners, in accordance with some examples of the present disclosure.

As shown in FIG. 8, in use, the system 100 can comprise a substrate 155 with multiple dimples 160 formed thereon in a predetermined pattern. The pattern can be based on the arrangement of the object(s) to be attached to the substrate 155, for example, or can simply be a geometric pattern based on the number of fasteners required to achieve the required fastening strength. If, as shown, a PCB 805 is to be attached to the substrate 155, for example, the dimples 160 can be arranged such that they align with mounting holes 810 in the PCB 805. The PCB 805 can then be attached to the substrate 155 using a plurality of fasteners 815. In some examples, washers 820, or other suitable spacers or insulators can also be utilized.

This can be useful, for example, when attaching a PCB 805, or other electronics, to the case of an electronic device such as a tablet or smart phone. In other words, it may be desirable to provide a tablet with an aluminum or stainless steel case, for example, to provide an attractive, corrosion resistant exterior. These materials may not have the mechanical properties, however, to enable a PCB, antenna, or other devices to be bolted to the case. Aluminum, for example, is corrosion resistant and can be quite strong, but does not generally have the hardness required for direct threading and bolting. In automotive applications, for example, steel thread inserts are often provided in aluminum parts to provide strong threads and deter dissimilar metal corrosion between steel bolts and the aluminum housing.

Similarly, one solution for electronics is to affix steel screw bosses, for example, to the case to enable the case to be made of an aesthetically pleasing material, but which may not have the desired physical properties. In this case, the screw bosses contain the threads for fasteners to attach items to the case. In some cases, depending on the two materials, the screw bosses 150 can be welded, soldered, or braised to the case. This can present issues when the materials are different metals, however, as it is often difficult or impossible to weld dissimilar metals. It is not possible to weld steel to aluminum, for example, using commonly available welding techniques (e.g., MIG or TIG welding).

To this end, the system 800 addresses both the mechanical and manufacturing issues by providing a method for attaching a screw boss 150 comprising a first material, with the necessary mechanical properties, to a case comprising a second, different material, with the desired aesthetic properties, for example. The use of threads and adhesive overcomes the problem of attaching dissimilar metals by welding, or other conventional processes. In other words, the increased contact area between the threads on the screw boss and the dimple coupled with adhesive overcomes any inherent mechanical deficiencies in the substrate. In addition, as discussed above, the adhesive can be applied such that the threads provide a conductive pathway between the screw bosses and the substrate. In this manner, the case can be manufactured from a material with desirable aesthetic or mechanical properties, while the screw bosses can provide different, desirable mechanical properties, among other things.

Figure 9A:
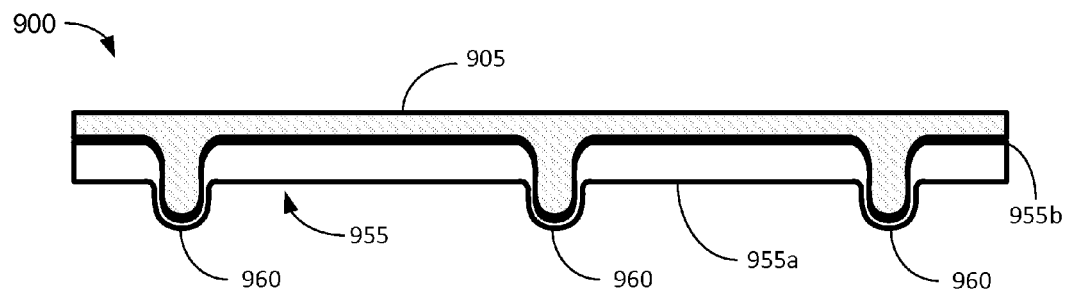
FIGS. 9A-9C depict a process for applying a second layer to the substrate to form a protective or aesthetic surface, in accordance with some examples of the present disclosure.
Figure 9B:
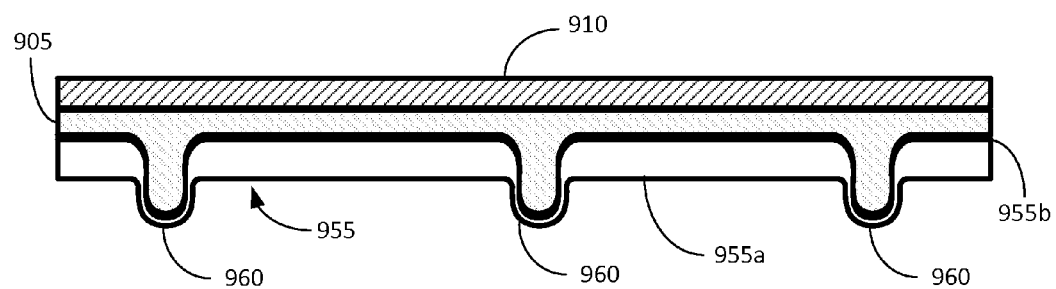
Figure 9C:
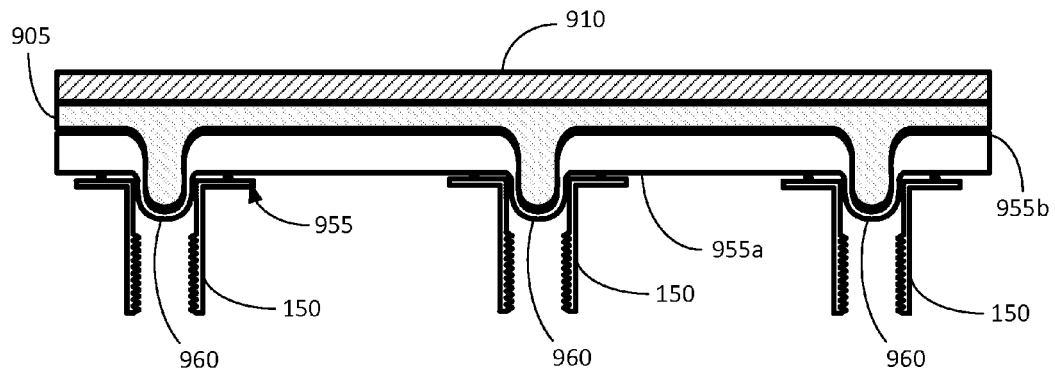

As shown in FIGS. 9A-9C, in still other examples, it may be desirable to create a substrate 955 with a smooth outward appearance, rather than a plurality of dimples 960. As a result, in some examples, the system 900 can further include a plurality of dimples 960 on a first side 955a of the substrate 955 and a self-leveling layer 905 applied to the second side 955b of the substrate 955. As the name implies, the self-leveling layer 905 can fill in the dimples 960 to produce a substantially smooth surface on the second side 955b of the substrate 955.

In some examples, the self-leveling layer 905 can comprise a structural material to provide additional rigidity to the substrate 955. In this role, the self-leveling layer 905 can comprise, for example, a liquid polymer, epoxy, or acrylic material that can be applied to the substrate 955 and then cured. The self-leveling layer 905 can comprise a material that is air-cured, for example, or cured using heat, IR, UV, or other energy sources. In other examples, the self-leveling layer 905 can comprise an aesthetic layer for providing color and/or patterns to the substrate 955. This may be useful when the substrate 955 comprises the case of a personal electronic device, for example.

In some examples, the self-leveling layer 905 can also comprise a self-adhesive polymer layer disposed on the second side 955b of the substrate 955. In the manner, a decorative sheet of hard plastic, for example, can be applied to the second side 955b of the substrate 955. The plastic sheet can include, for example, a design, logo, or other artwork for the device. The stiffness of the sheet can serve to cover the "holes" created by the dimples 960 on the second side 955b of the substrate 955 and, in some examples, can also provide additional impact resistance and stiffness to the substrate 955. The plastic sheet can be attached to the substrate using an adhesive layer on the plastic sheet, or can be attached using glue, epoxy, polyurethane, or acrylic adhesive, among other things.

In some examples, as shown in FIG. 9B, an additional layer 910 can be applied to the substrate 955. In some examples, the additional layer 910 can comprise a structural layer to provide additional protection and/or rigidity to the device. In this configuration, the additional layer 910 can comprise a sheet of, for example, aluminum, titanium, magnesium, or a polymer (e.g., Polyethylene terephthalate, or PET), among other things. In other examples, the additional layer 910 can comprise a purely aesthetic layer. The additional layer 910 can comprise, for example, a decal, decorative paper, a plastic cover, or a veneer. This can enable a personal electronic device to have a faux wood, carbon fiber, or striped cover, for example, without significantly increasing the weight or thickness of the device. In some examples, the additional layer 910 can comprise a layer of putty (e.g., fiberglass putty) that is applied, sanded smooth, and then has an a decorative layer applied thereto. In still other examples, the additional layer 910 can comprise a soft-touch paint, or other suitable paint, applied over the aforementioned putty layer (ie., the additional layer 910 comprises a layer of putty and a layer of paint).

As shown in FIG. 9C, the assembled system 900 can comprise a substrate 955, a self-leveling layer 905, and a plurality of screw bosses 150 to enable one or more items to be attached to the substrate 955. In some examples, the system 900 can further comprise an additional structural and/or decorative layer 910. In either configuration, the system 900 can provide a cover for a personal electronic device, for example, that has the necessary mechanically strength for attaching elements (e.g., electronic components, PCBs, etc.) on one side 955a, while providing an attractive, durable cover on the other side 955b. The cover can also provide a smooth outer surface for the device by covering the depressions formed by the back sides of the dimples 960 on the second side 955a of the substrate 955.

Figure 10A:
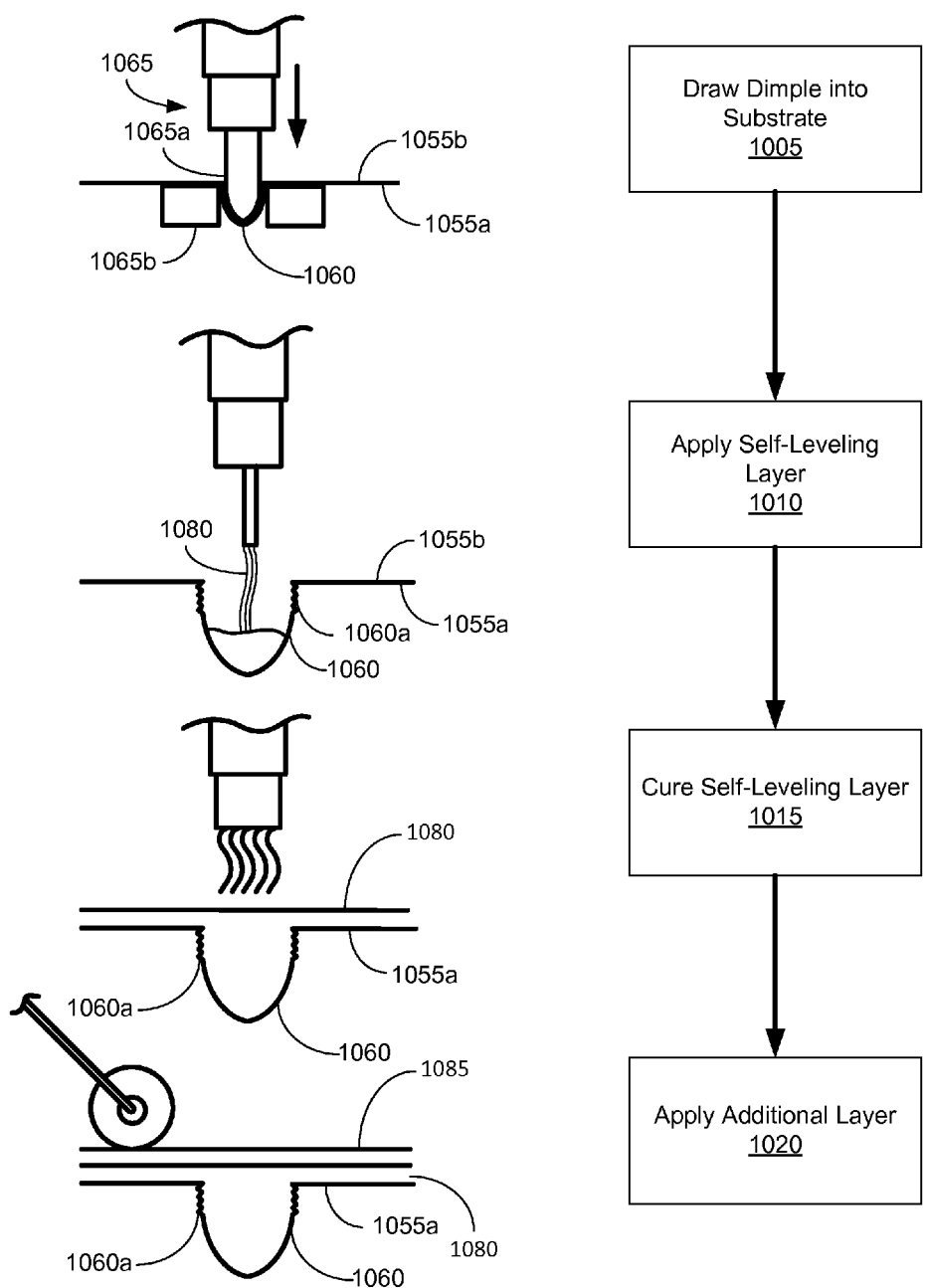
FIGS. 10A-10B are a pictorial flow diagram of an illustrative process for providing a second, decorative or protective layer on a substrate, in accordance with some examples of the present disclosure.
Figure 10B:
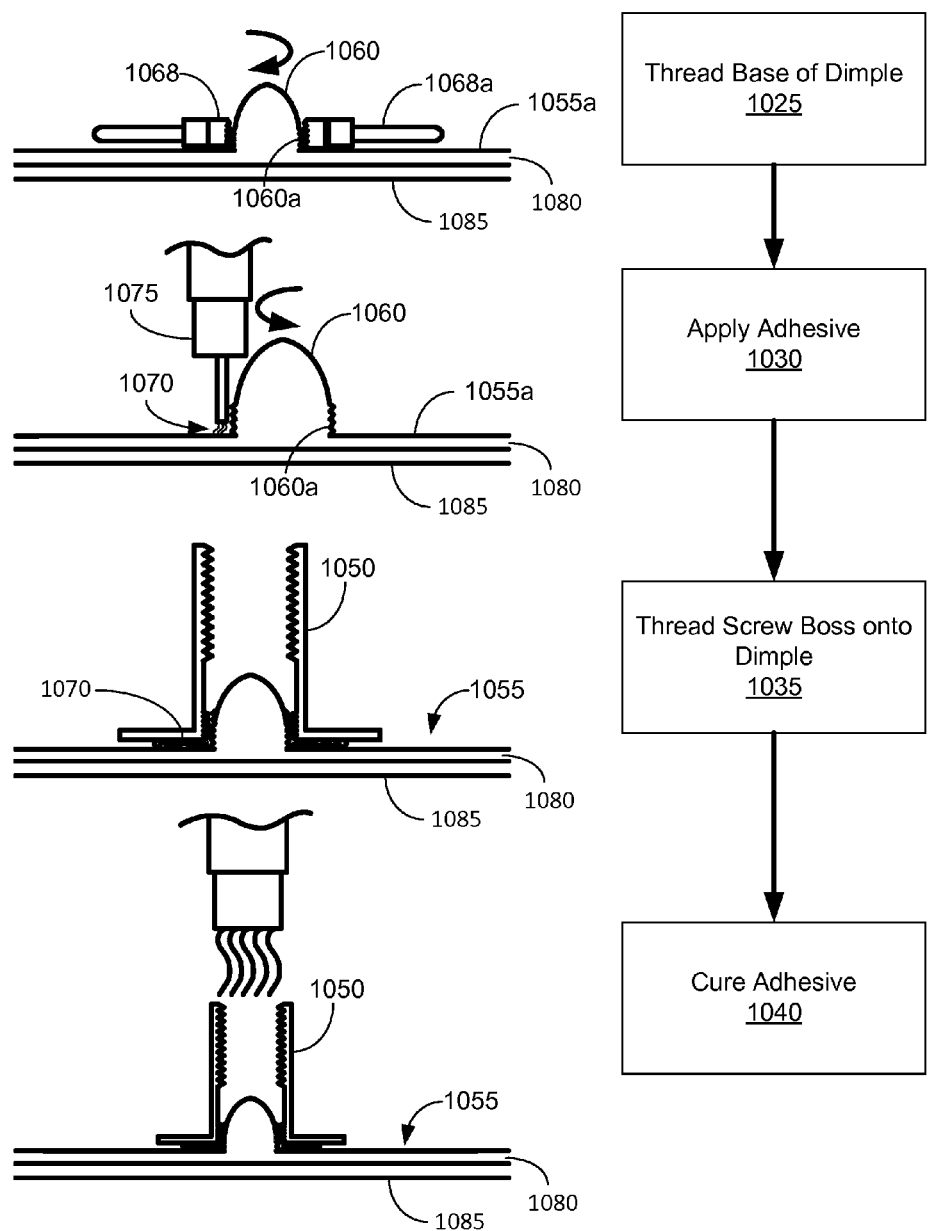

As shown in FIGS. 10A and 10B, embodiments of the present disclosure can also comprise a method for making a substrate with a structural or decorative layer. At 1005, to provide a mounting surface for a screw boss assembly 1050, a dimple 1060 can be created in a first side 1055a of the substrate 1055 using a suitable method. This can include using a dimple-die machine 1065, for example, in which a bit 1065a forces the substrate 1055 through a die 1065b to form the dimple 1060. Of course, other methods for metal forming and drawing are available and are contemplated herein. In some examples, the dimple 1060 can be formed in the substrate 1055 without tearing or piercing the substrate 1055. In other examples, the substrate 1055 may be dimpled and perforated to provide a physical pathway from one side of the substrate 1055 to the other.

At 1010, an adhesive or filler layer 1080 can be applied to a second side 1055b of the substrate 1055 to fill in the dimple 1060 and provide a smooth surface on the second side 1055b of the substrate 1055. In some examples, the filler 1080 can comprise a multi-part epoxy, a urethane, or an acrylic filler material. The filler 1080 can comprise, for example, a liquid, paste, or gel that can be poured, spread, or otherwise applied, to the second side 1055b of the substrate 1055 to fill in the dimple 1060. In some examples, the filler 1080 can comprise a self-leveling liquid that can be cured or dried into a hard, smooth, and/or flat surface. In this manner, the second side 1055b of the substrate 1055 can present a relatively smooth, flat surface for the attachment of covers, decorative panels, or other additional layers.

At 1015, the filler 1080 can be cured to form a substantially flat, solid layer on the second side 1055b of the substrate 1055. In some examples, the filler 1080 can be an air-drying filler or glue and can simple be given time to "dry." In other examples, the filler 1080 can comprise a primary component and a catalyst, a multi-part adhesive (e.g., two part epoxy), which cures as the result of a chemical reaction. In some examples, energy can be applied to accelerate the curing process. Depending on the type of adhesive, the curing process can be accelerated using a variety of known methods including, for example, heat, IR, RF, or UV curing.

At 1020, in some examples, an additional layer 1085 can be applied to the filler 1080. The additional layer 1085 can comprise, for example, a protective sheet to resist bending and/or provide impact resistance. In this configuration, the additional layer 1085 can comprise, for example, aluminum, steel, stainless steel, and titanium. The additional layer 1085 can also comprise plastic and other polymers. The additional layer 1085 can also comprise carbon fiber, fiberglass, aramid, and other composite materials. In some examples, the additional layer 1085 can be purely for aesthetic purposes and can comprise, for example, a decal, logo, or decorative paper layer.

At 1025, in some examples, a portion 1060a of the dimple 1060 can be threaded using a suitable method. In some examples, the dimple 1060 can be threaded using a threading die 1068. The threading die 1068 can be placed over the dimple 1060 to the point of engagement and then rotated to cut threads into an outer portion 1060a of the dimple 1060. The threading die 1068 can be rotated directly by a tapping machine, for example, or using a suitable tool such as a tap handle 1068a. In some examples, as discussed below, this step can be optionally replaced with a "self-tapping" screw boss 1050.

At 1030, adhesive 1070 can be applied to the first side 1055a substrate 1055 proximate the dimple 1060. In some examples, the adhesive 1070 can be applied with an automatic or robotic applicator 1075 to provide a bead around the dimple 1060. In some examples, the adhesive 1070 can be applied with a predetermined height, or thickness, to produce the desired bond strength between the screw boss 1050 and the substrate 1055. In other examples, the adhesive 1070 can be manually applied with an applicator gun, brush, syringe, or other suitable means. The adhesive can enable a screw boss 1050 to be mounted on the dimple 1060 and can provide additional strength at the junction therebetween.

The adhesive 1070 can be chosen based on, for example, the required bond, shear, and tensile strengths for the product, as well as the type of testing the product must endure.

As mentioned above, products, such as cell phones and tablets, which are subjected to drop tests, for example, may require an adhesive with lower overall bond strength, but that produce a more resilient joint. Other products, where strength is the main concern, may use a more brittle, or "glassy," adhesive, that has a higher tensile strength, for example, but is not as "tough." The adhesive 1070 can comprise, for example, multipart epoxy, acrylic, or urethane adhesive, among other things.

At 1035, the screw boss 1050 can be threaded onto the dimple 1060. Threading the screw boss 1050 onto the dimple 1060 can achieve multiple ends in addition to providing a mechanical connection between the screw boss 1050 and the substrate 1055. Threaded engagement between conductive (e.g., metal) elements, for example, provides a good, low resistance electrical connection. In some examples, therefore, the threaded engagement between the screw boss 1050 and the dimple 1060 can enable the substrate 1055 to act as a ground plane for any electronics mounted thereon. Threading the screw boss 1050 onto the dimple 1060 can also enable the screw boss 1050 to squeeze, flatten, and spread the adhesive 1070 between the screw boss 1050 and the substrate 1055. In this manner, good mechanical adhesion and proper adhesive layer thickness can be controlled. As discussed below, devices on the screw boss 1050 can also ensure consistent adhesive layer thickness by mechanically locating the height of the screw boss 1050 above the substrate.

At 1040, the adhesive can be cured. In some examples, the adhesive can be an air-drying adhesive or glue and can simple be given time to "dry." In other examples, the adhesive can comprise an adhesive agent and a catalyst, a multi-part adhesive (e.g., two part epoxy), or other catalytic adhesive, which cures as the result of a chemical reaction. In some examples, energy can be applied to accelerate the curing process. Depending on the type of adhesive, the curing process can be accelerated using a variety of known methods including, for example, heat, IR, RF, or UV curing.

While several possible examples are disclosed above, examples of the present disclosure are not so limited. For instance, while a system for providing screw bosses on various substrates for use with electronics is discloses, the system can also be used for other applications in which a threaded fastener is used to attach elements to a substrate. In addition, the location and configuration of various features of examples of the present disclosure such as, for example, the diameter and depth of the dimple, the type and number of threads, and the types of adhesives can be varied according to a particular substrate, strength requirement, mounting location, or weight or power constraints. Such changes are intended to be embraced within the scope of this disclosure.

The specific configurations, choice of materials, and the size and shape of various elements can be varied according to particular design specifications or constraints requiring a device, system, or method constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

What is claimed is:

1. A system comprising:
    a substrate comprising a dimple formed on a first side of the substrate;
    a screw boss comprising:
        a first set of threads, disposed proximate a first end of the screw boss, threadably engageable with the dimple;
        a second set of threads disposed proximate a second end of the screw boss; and
        a standoff, comprising a raised, circular ring disposed on the first end of the screw boss between the first end of the screw boss and the first side of the substrate to maintain a gap between the first end of the screw boss and the first side of the substrate, the standoff having a first height; and
    an adhesive layer proximate a base of the dimple, wherein the adhesive layer is in contact with the first side of the substrate and the first end of the screw boss;
    wherein the adhesive layer is at least partially compressed between the first end of the screw boss and the first side of the substrate during installation of the screw boss.

2. The system of claim 1, wherein the first set of threads provides an electrical pathway between the screw boss and the substrate via the dimple.

3. The system of claim 1, further comprising:
    a filler layer disposed on the second side of the substrate to fill in the dimple.

4. A system comprising:
    a substrate with a dimple formed on a first side of the substrate;
    a filler layer applied to a second side of the substrate to fill in the dimple and form a substantially smooth, solid surface;
    an adhesive layer disposed proximate a base portion of the dimple; and
    a screw boss, with a first end and a second end, the first end comprising a first set of threads mechanically engaged with the base portion of the dimple and the second end comprising a second set of threads.

5. The system of claim 4, further comprising:
    an additional layer disposed on the filler layer.

6. The system of claim 5, wherein the additional layer comprises a soft-touch paint layer applied to the filler layer.

7. The system of claim 5, wherein the additional layer comprises a layer of polymer applied to the filler layer.

8. The system of claim 7, wherein the layer of polymer comprises polyethylene terephthalate (PET) film.

9. The system of claim 4, further comprising:
    a layer of putty applied to the filler layer; and
    a layer of paint applied to the layer of putty.

10. The system of claim 4, wherein applying the filler layer comprises applying a self-leveling liquid or gel to the second side of the substrate.

11. The system of claim 4, wherein the first set of threads comprises a different thread pitch, a different thread size, or both.

12. The system of claim 4, the screw boss further comprising:
    a plurality of standoffs disposed on the first side of the screw boss to maintain a gap between the first end of the screw boss and the first side of the substrate, the plurality of standoffs having a first height.

* * * * *